US 006645313B2

(12) United States Patent
Goyal et al.

(10) Patent No.: US 6,645,313 B2
(45) Date of Patent: Nov. 11, 2003

(54) POWDER-IN-TUBE AND THICK-FILM METHODS OF FABRICATING HIGH TEMPERATURE SUPERCONDUCTORS HAVING ENHANCED BIAXIAL TEXTURE

(75) Inventors: Amit Goyal, Knoxville, TN (US); Donald M. Kroeger, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/081,320

(22) Filed: Feb. 22, 2002

(65) Prior Publication Data

US 2003/0162667 A1 Aug. 28, 2003

(51) Int. Cl.[7] ................................................ C22C 9/02
(52) U.S. Cl. ...................... 148/96; 148/516; 148/519; 505/433
(58) Field of Search ........................ 148/96, 516, 519, 148/537; 505/433, 447

(56) References Cited

U.S. PATENT DOCUMENTS

| | | | | | |
|---|---|---|---|---|---|
| 5,741,377 | A | * | 4/1998 | Goyal et al. .................. | 148/512 |
| 6,022,832 | A | * | 2/2000 | Fritzemeier et al. ......... | 505/461 |
| 6,106,615 | A | * | 8/2000 | Goyal et al. ................... | 117/84 |
| 6,180,570 | B1 | * | 1/2001 | Goyal .......................... | 505/236 |
| 6,256,521 | B1 | * | 7/2001 | Lee et al. .................... | 505/230 |
| 6,455,166 | B1 |   | 9/2002 | Truchan et al. | |
| 6,458,223 | B1 | * | 10/2002 | Hans Thieme et al. ...... | 148/435 |

* cited by examiner

*Primary Examiner*—George Wyszomierski
(74) *Attorney, Agent, or Firm*—Akerman Senterfitt

(57) ABSTRACT

A method for forming an electronically active biaxially textured article includes the steps of providing a substrate having a single crystal metal or metal alloy surface, deforming the substrate to form an elongated substrate surface having biaxial texture and depositing an epitaxial electronically active layer on the biaxially textured surface. The method can include at least one annealing step after the deforming step to produce the biaxially textured substrate surface. The invention can be used to form improved biaxially textured articles, such as superconducting wire and tape articles having improved $J_c$ values.

47 Claims, 11 Drawing Sheets

POWDER-IN-TUBE AND THICK-FILM METHODS OF FABRICATING HIGH TEMPERATURE SUPERCONDUCTORS HAVING ENHANCED BIAXIAL TEXTURE

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

CROSS-REFERENCE TO RELATED APPLICATIONS

Not Applicable

FIELD OF THE INVENTION

The invention relates to biaxially textured metal substrates and articles made therefrom, and more particular to superconductor wires and tapes.

BACKGROUND OF THE INVENTION

One important characteristic regarding applications of high-temperature superconducting wires and tapes is the amount of current the superconductor can carry. The current carrying capability of high-temperature superconductors is generally influenced by several factors, the most important ones being operating temperature, operating field, and the microstructure of the superconductor.

Operating temperature and field are external factors which can be generally controlled to the extent possible independently of the microstructure of the high temperature superconducting wire. The lower the operating temperature, the more current a superconducting wire can carry. Operating fields have a similar effect. The smaller the field, the more current a superconducting wire can carry. Unfortunately, many electric power powerline applications operate in high fields and at significant temperatures, the fields being up to 5 T and temperatures often being at least 50 K, or more. Thus, efforts to improve the current carrying capability of high temperature superconductor wires and tapes have focused on improving the microstructure of the superconductor layer.

The superconductor layer microstructure for both epitaxial thin film superconductors and superconducting tapes and wires is heavily influenced by the presence of grain boundaries. Epitaxial superconducting thin films on single crystal ceramic substrates such as $SrTiO_3$ or $LaAlO_3$ have no grain boundaries, are relatively small area films having areas generally up to several $cm^2$, and possess the best high temperature superconductor properties known, having $J_c$ values over 1 $MA/cm^2$ at 77 K in self-field for YBCO. These superconducting thin films are currently used in device applications in the cellular industry, such as for filters in cellular base stations.

On the other hand, superconducting wires and tapes are used for applications such as power transmission lines, transformers, motors, generators, fault current limiters and magnets, and in medical applications as magnets for MRI and NMR. Each of these applications noted above generally require superconducting tape/wire lengths to be in the range of 100 m to 1 km, or more. Superconducting wires and tapes generally have critical current densities ($J_c$) which are generally 10 to 100 times less than epitaxial thin film high temperature superconductors. Thus, the microstructure of superconducting wires and tapes offers great potential for improvement as wires and tapes attempt to approach the superconducting properties provided by epitaxial thin film superconductor films.

Various manufacturing techniques exist to produce long length wire and tapes, the powder-in-tube (PIT) approach being the most commonly used [1–3]. References 1–3 use the PIT method to form uniaxially textured PIT tapes. In PIT, a superconducting powder is placed inside a hollowed tube, commonly a silver tube. The tube is generally evacuated, sealed, and then pulled (wire-drawn), stretched or otherwise deformed (rolled) to result in the desired shape of a tape or wire. After shaping, the tube is subjected to one or more heat treatments to result in some portion of the superconductor formed having superconducting properties. Similarly, using a "thick film" process, a superconductor mixture is coated onto a metallic substrate having a shape of a tape or wire resulting from a deformation process, then the article is heat treated.

Powder-in-tube methods have proved somewhat successful for the Bi-(Pb)-Sr-Ca-Cu-O (BSCCO) family of superconductors. Typically the superconducting core, being the superconducting material closest to the Ag tube material, has a strong fiber texture with its c-axis aligned perpendicular to the tape surface. However, no in-plane texture is observed on a macroscopic or a local scale [4]. Recent electron backscatter measurements have revealed that such tapes have a grain boundary misorientation texture. Examination of over 227 spatially connected grain boundaries indicated that over 40% of the grain boundaries have misorientations angles which are less than 15 degrees. Percolative current paths consisting of such low angle boundaries can easily be traced in the material. It has been suggested that strongly linked current flow in these tapes is a direct consequence of the enhanced number of small angle grain boundaries [4]. These observations are consistent with measurements across single grain boundaries in various high temperature superconductor epitaxial thin films which indicate the strong dependence of critical current density ($J_c$) on misorientation angle of individual superconducting grains [5103].

Comparison of the $J_c$ of typical PIT tapes to that of epitaxial films indicates that only approximately 1–5% of the tape cross-section is effectively carrying all of the current. This is consistent with the percolative nature of the current flow as suggested by the microstructure of the tapes [4]. Enhanced high temperature superconductor wires and tapes could be produced if the resulting texture could provide a larger percentage of the superconducting layer having primarily low angle grain boundaries.

A method to fabricate superconducting wire and tapes with properties similar to that obtained for epitaxial thin film superconductors on single crystal ceramic substrates has been proposed previously [6]. In this method, a polycrystalline, randomly oriented bar or rod of metal is thermomechanically processed to produce a biaxially textured substrate. Epitaxial oxide buffer layers and superconductors can then be grown on the biaxially textured metal substrate. This process can yield critical current densities higher than 1 $MA/cm^2$ at 77K and self-field.

Such a technique is however is only generally applicable to the fabrication of thick film superconducting tapes. Furthermore, this technique can only be applied to those metals and alloys which preferentially form a single texture component, and produce biaxial texture upon rolling and recrystallization. Lastly, this technique can limit the attainable degree of biaxial texture that can be reproducibly produced even in metals/alloys which produce sharp biaxial texture upon rolling and annealing.

References Cited

1. K. Sato, T. Hiakata, H. Mukai, M. Ueyama, T. Kato, T. Matsuda, M. Nagata, K. Iwata and T. Mitsui, IEEE Trans. Magn., 27 (1991) 1231.
2. K. Heine, J. Tenbrink and M. Thoner, Appl. Phys. Lett., 55 (1991) 2441.
3. R. Flukiger, B. Hensel, A. Jeremie, M. Decroux, H. Kupfer, W. Jahn, E. Seibt, W. Goldacker, Y. Yamada and J. Q. Xu, Supercond, Sci & Tech., 5 (1992) S61.
4. A. Goyal, E. D. Specht, D. M. Kroeger, T. A. Mason, D. J. Dingley, G. N. Riley and M. W. Rupich, Appl. Phys. Lett., 66 (1995) 2903–2905.
5. D. Dimos, P. Chaudhari, J. Mannhart and F. K. Legoues, Phys. Rev. Lett., 61 (1988) 219; D. Dimos, P. Chaudhari and J. Mannhart, Phts. Rev. B41 (1990) 4038.
6. U.S. Pat. No. 5,741,377 to Goyal et al.

SUMMARY OF THE INVENTION

A new method for forming improved biaxially textured metal and metal alloy substrates is presented. The method can be used to fabricate high critical current density superconducting tapes and powder-in-tube tapes, having lengths of up to 1 km, or more. The resulting superconducting wires and tapes obtainable using the invention have critical current densities ($J_c$) which more closely approach $J_c$ values provided by epitaxial thin film high temperature superconductors, as compared to previous methods for forming superconducting wires and tapes.

A method for forming an electronically active biaxially textured article, preferable being a wire or tape, includes the steps of providing a substrate having a single crystal metal/alloy surface, deforming the substrate to form an elongated substrate surface having biaxial texture using a plurality of incremental deformations, and depositing an epitaxial electronically active layer on the biaxially textured surface.

The substrate can be made of any suitable metal or alloy. In some cases, the substrate is preferably a Ag or Ag alloy. A superconductor article having enhanced biaxial texture can be formed by this method. Rather than starting from a polycrystalline, randomly oriented bar or rod of a metal or alloy to produce a biaxial texture upon rolling, an embodiment of the invention starts with a single crystal metal/alloy rod, bar or tube, having a known crystallographic orientation. The deformation of the substrate of an appropriate crystallographic orientation can be performed by rolling without any intermediate anneals. In such cases, the crystallographic orientation selected is such that it has a stable crystal orientation with respect to rolling. This stable orientation can be maintained after heating the substrate at high temperatures.

The epitaxial electronically active layer can be a superconductor layer. Both the buffer layer and/or the superconducting layer can be deposited using a variety of processes, such as physical vapor deposition including pulsed laser ablation, sputtering, co-evaporation, pulsed electron beam evaporation, chemical vapor deposition (CVD) methods such as metallo-organic CVD or by solution routes such as dip coating, spray pyrolysis with metal organics or sol-gel solutions.

The superconductor layer may be an oxide superconductor. The oxide superconductor is preferably selected from $REBa_2Cu_3O_7$, where RE is a rare earth element, $(Bi,Pb)_1Sr_2Ca_{n-1}Cu_nO_{2n+2}$, where n is an integer between 1 and 4, $(Tl,Pb)_1Ba_2Ca_{n-1}Cu_nO_{2n+3}$, where n is an integer between 1 and 4, and $(Hg,Tl,Pb)_1Ba_2Ca_{n-}Cu_nO_{2n+2}$, where n is an integer between 1 and 4. It is noted that (Bi, Pb), (Tl,Pb) and (Hg, Tl, Pb) indicate doping of Pb, in (Tl, Pb) and (Bi, Pb) compounds and doping of Tl and Pb in (Hg, Tl, Pb) compounds, the doping being in any amount. Furthermore, Ca can be used as a dopant in RE for the $REBa_2Cu_3O_7$ compound shown above.

The method can also include the step of annealing the substrate after substrate deformation to form a biaxially textured surface having a different crystallographic orientation from that of the starting single crystal material. In this embodiment, the crystallographic orientation selected is such that it is a stable crystal orientation with respect to rolling, but this orientation is changed to the desired orientation of the substrate after heating the substrate at high temperatures. Epitaxial buffer layers and/or electronic device layers such as a superconductor layer can then be deposited after this annealing step.

In an alternate embodiment, the method can also involve deformation of the substrate in a plurality of incremental deformations, each of which can be followed by annealing the substrate to regain any loss or spread of the original crystallographic orientation of the substrate. Successive thermomechanical processing can then used to produce a tape of the starting single crystal material having the desired dimensions.

An optional epitaxial buffer layer can be deposited on the biaxially textured substrate surface. The epitaxial buffer layer is preferably selected from $SrTiO_3$, Nb-doped $SrTiO_3$, $LaMnO_3$, $LaAlO_3$, $La_2ZrO_3$, YSZ, MgO, $CeO_2$ and $Y_2O_3$.

In yet another embodiment of the invention, a method for forming textured alloy articles having biaxial texture is described. A single crystal metal substrate is provided which is deformed to form an elongated substrate surface having biaxial texture on the elongated substrate surface. A second metal, which is different from the first metal, is then diffused into the elongated substrate surface to form a biaxially textured alloy. The substrate may also be annealed to produce the biaxially texture substrate surface. A superconductor article having enhanced biaxial texture can be formed by this method.

Yet another embodiment of this invention is a method for forming an electronically active biaxially textured article, preferable being a wire or tape, by providing a single crystal metal/alloy tube, then filling the tube with superconducting or other electronically active prescursor powder material or a rod thereof. Lids can then be placed on either ends of the tube by welding, swaging or other mechanical process. The powder-in-tube or rod-in-tube are then mechanically deformed to form an elongated tape having biaxial texture in its sheath which was crystallographically a single crystal prior to deformation. The composite tube is then annealed to crystallize the superconductor precursor or other precursor so as to form epitaxially from the biaxially textured sheath of the tape. The sheath can be made of any suitable metal or alloy. In some cases the sheath is preferably made of either Ag or a Ag alloy. A superconductor article having enhanced biaxial texture can be formed by this method.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE PREFERRED EMBODIMENTS

The invention provides a method for producing high temperature, electronically active, biaxially textured articles from an elongated single crystal substrate. The invention is particularly well suited for the formation of electronically active wire and tape (hereafter "tape") articles which have biaxial texture. As used herein, the phrase "biaxial texture" is defined as a texture having substantially all grains oriented within 15 degrees of each other in all three spatial directions. The invention is expected to be helpful when applied to electronically active devices for which the physical property in question can be benefited by providing consistent low angle grain boundaries.

Electronically active layers can include not only superconductors, but also semiconductors, ferro-electrics or opto-electrics, for example. The invention is particularly useful when applied to superconductors, by providing a method to provide biaxial texture on a tape over a long length, such as up to 1 km, or more. It has been recognized that the $J_c$ of superconducting tapes can be increased by decreasing the number of high angle grain boundaries in the superconducting layer [A. Goyal, E. D. Specht, D. M. Kroeger, T. A. Mason, D. J. Dingley, G. N. Riley and M. W. Rupich, Appl. Phys. Lett., 66 (1995) 2903-2905].

Figure 1:
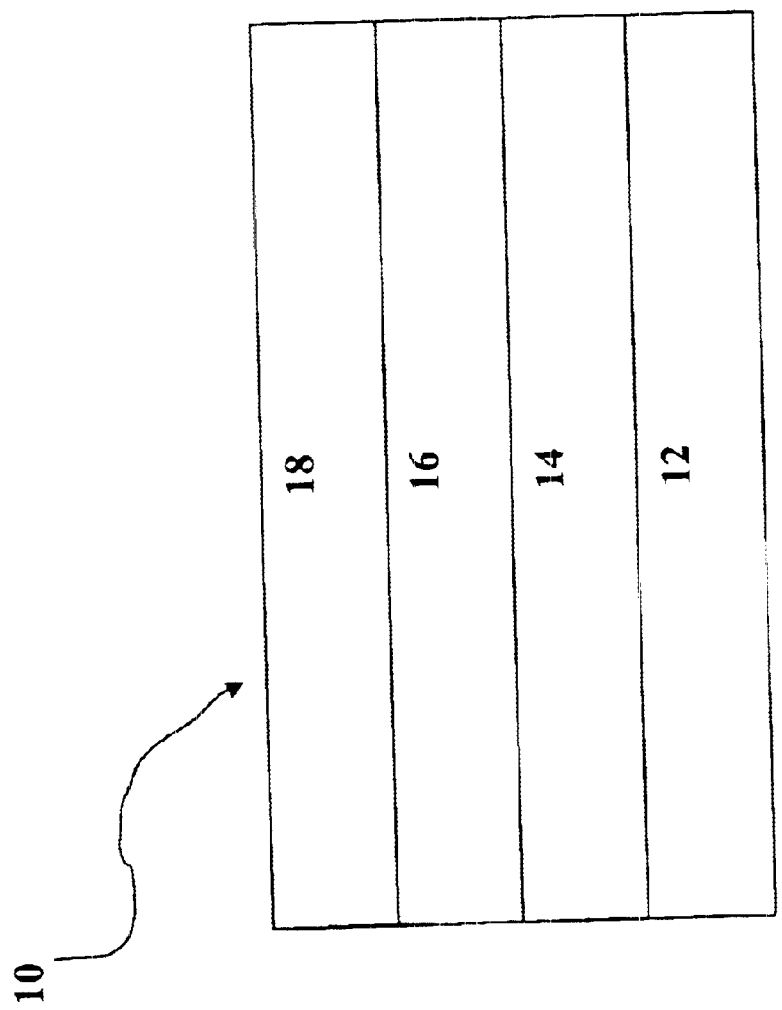
FIG. 1 is a cross-sectional view of a superconductor tape article having a multilayer buffer composition.

FIG. 1 shows a tape article 10 according to an embodiment of the invention having a multi-layer composition including a textured superconductor tape 18 having biaxial texture along its entire length. The tape article 10 is expected to be particularly useful for increasing the current carrying capability and reducing AC losses of power transmission lines.

Superconductor article 10 consists of a substrate having a biaxially-textured metal surface 12, optionally at least one buffer layer 14 and 16, and a superconducting layer 18. The biaxially-textured metal surface 12 can be formed by deforming a single crystal substrate as explained in detail later. An appropriate biaxially textured substrate surface 12 permits epitaxial layers, such as epitaxial superconductor layer 18, to be formed thereon.

For example, silver and certain of its alloys are known to have epitaxial relationships with some common HTSC materials [Y. Feng and D. C. Larbalestier, Interface Science, 1 (1993) 401; J. Budai and R. T. Young, Physica C, 1993]. However, applied to electronically active devices in general, the invention is applicable to a wide variety of metals and metal alloys. Even certain metals and metal alloys that do not result in biaxial texture upon rolling can be used with the invention, because unlike conventional rolling processes which rely on biaxial texture formation upon rolling, the invention derives biaxial texture in the substrate from the texture of a single crystal substrate.

For example, an alloy such as 82% Ni/16% Cr/ 2% W, which is known to not result in a biaxial texture upon conventional rolling, can be formed as a biaxially textured substrate starting with a single crystal, to form an epitaxial electronically active epitaxial article, such as a superconductor article. In this regard, the invention may find use in forming biaxially textured tapes, when the desired substrate choice, such as a particular strongly non-magnetic substrate, does not form biaxial texture upon rolling and recrystallization.

When applied to superconductor articles, Ag and its alloys with additions of at least one of Mg, Cu, Ti, Pd, Al are preferred substrate tape choices, where the alloying metal is a minor component in the alloy and is generally used for structural strengthening purposes. Such alloys are routinely used in convention PIT processes for BSCCO based superconductors to form uniaxially textured superconducting layers.

The biaxially-textured metal surface of substrate 12 provides support for the superconductor article 10, and can be fabricated over long lengths and large areas using the invention. When the thick film method is used, one or more epitaxial metal oxide buffer layers 14, 16 can be included with superconductor article 10. When the superconductor tape is of long length (e.g. 1 km), buffer layers 14 and 16 may be deposited on biaxially-textured substrate surface 12 using a suitable process, such as reel-to-reel translation.

The buffer layers 14, 16 are commonly formed from $Y_2O_3$ or $CeO_2$, and serve as chemical barriers between the metal surface 12 and the last layer, the last layer generally being superconducting layer 18. If used with the invention, preferred buffer layer materials include $SrTiO_3$, Nb-doped $SrTiO_3$, $LaMnO_3$, $LaAlO_3$, $La_2ZrO_3$, YSZ, $CeO_2$ or $Y_2O_3$.

However, in PIT processing, most applications involve Ag-based alloys for which a buffer layer is intentionally omitted. Thus, article 10 formed from a PIT process generally will have superconducting layer 18 disposed directly on the biaxially-textured substrate surface 12.

For most electronically active layer applications, the single crystal substrate can be essentially any metal or metal alloy. In the PIT embodiment of the invention, a single crystal silver billet is first generally formed into a hollow tube using a drilling method such as electro-discharge machining. The powder of an electronically active material, such as a superconductor precursor, optionally in rod form, is then placed in the hollow tube as in standard PIT processing. A mechanical deformation such as pulling, stretching or rolling sequence with intermediate steps of annealing is then generally used to produce a desired biaxial texture on the final rolled tape to be epitaxially compatible with the orientation of the desired electronically active layer. The inventors have found that if the deformations are small enough followed by appropriate annealing steps which remove substantially all damage rendered to the single crystal from the rolling step, a single crystal-like tape results, the tape having the same crystallographic orientation as the starting texture of the tube.

The specifics of the particular mechanical deformation process required can be determined empirically from experiments on single crystals. When applied to superconductor tapes using the PIT method, a PIT silver (or its alloy) sheathed tape of HTSC can be formed in which the silver (or its alloy) substrate is textured in a similar manner having biaxial texture at substantially all points along the entire length of the tape.

Multifilamentary tapes can be produced by starting from similarly oriented starting billet materials. A mechanical deformation such as pulling, stretching or a rolling sequence with intermediate steps of annealing is then generally used to produce a desired biaxial texture on the final rolled tape to be epitaxially compatible with the orientation of the desired electronically active layer. If the deformations are small enough followed by appropriate annealing steps which remove substantially all damage rendered to the single crystal from the rolling step, the tube can have the same crystallographic orientation as the starting single crystal. The specifics of the particular mechanical deformation process required can be determined empirically from experiments on single crystals.

When applied to superconductor tapes using the PIT method, a PIT silver (or Ag alloy) sheathed tape of HTSC can be formed in which the silver (or Ag alloy) is textured in a similar manner having biaxial texture at substantially all points along the entire length of the tape. As noted above, this method can be extended to any HTSC or other electronically active material and/or substrate material.

In another embodiment of this invention relating to the PIT method, a single crystal silver billet is first formed into a hollow tube using a drilling method such as electro-discharge machining. The powder of an electronically active material, such as a superconductor precursor, optionally in rod form, is placed in the tube as in standard PIT processing. A mechanical deformation such as pulling, stretching or rolling sequence is used without intermediate annealing steps. The PIT is then finally annealed after the deformation is complete to produce the biaxial texture of the desired crystallographic orientation.

The tube containing the electronically active precursor material inside is then annealed at an appropriate temperatures to form an epitaxial layer electronically active layer on the tube material. The specifics of the particular mechanical deformation process required can be determined empirically from experiments on single crystals. When applied to superconductor tapes using the PIT method, a PIT silver (Ag alloy) sheathed tape of HTSC can be formed in which the silver (or Ag alloy) is textured in a similar manner having biaxial texture at substantially all points along the entire length of the tape.

In yet another embodiment of this invention, multifilamentary tapes can be produced by starting from similarly oriented starting billet materials. A mechanical deformation such as pulling, stretching or rolling sequence is used without any intermediate steps of annealing. The PIT is then finally annealed to produce the desired biaxial texture. The specifics of the particular mechanical deformation process required can be determined empirically from experiments on single crystals. When the superconductor crystallizes from the typically powered precursor, it will be aligned due to an epitaxial relationship with the biaxially aligned substrate. As noted above, this method can be extended to any HTSC or other electronically active material and/or substrate material.

Alternatively, a biaxially oriented tape formed from a single crystal material can be applied to a thick film process. Starting with a single crystal of an appropriate substrate with a desired crystal orientation, such as Ag in the case of superconductors, the single crystal substrate can be wire drawn and/or rolled with intermediate annealing steps after approximately 5–20% total deformations to make a long (e.g. 1 km) substrate. The purpose of intermediate anneals is to restore the deformed single crystal substantially back to its initial crystallographic orientation. If the deformations are small enough followed by appropriate annealing steps which remove substantially all damage rendered to the single crystal from the rolling step, a single crystal-like tape can be produced, the tape having no discernable grain boundaries and accordingly characterized as a single grain material. Many steps of rolling and annealing are generally involved so as to produce the final elongated substrate with the same crystallographic orientation as the starting single crystal bar/rod/sheet.

For example, a one inch by one inch single crystal substrate having a one foot length can be mechanically deformed to a tape 1 km in length with various widths and thicknesses. The starting single crystal orientations remain the same in each such case.

Electronically active materials, such as superconductor materials, can then be deposited on the textured tape with or without intermediate buffer layer(s) by using the processes of physical vapor deposition such as pulsed laser ablation, sputtering, co-evaporation, pulsed electron beam evaporation, chemical vapor deposition (CVD) methods such as metallo-organic CVD or by solution routes such as dip coating, spray pyrolysis with metal organics or sol-gel solutions.

Intermediate layers between the substrate and the electronically active materials may be used, such as buffer layer 14 and 16 shown with superconducting article 10 in FIG. 1. In certain cases, such as ex-situ processes such as sol-gel coatings and the ex-situ $BaF_2$ process, and annealing under appropriate conditions, the superconductor crystallizes in an aligned manner forming a layer epitaxial with the underlying biaxially textured tape substrate. In the case of vapor deposition techniques, epitaxial orientation of the superconductor layer 18 may occur on deposition alone, without the need for an additional annealing step.

Superconductor layer 18 is preferably an oxide superconductor. The oxide superconductor is preferably selected from $REBa_2Cu_3O_7$ where RE is a rare earth element, $(Bi, Pb)_1Sr_2Ca_{n-1},Cu_n O_{2n+2}$, where n is an integer between 1 and 4, $(Tl,Pb)_1Ba_2Ca_{n-1}Cu_n O_{2n+3}$, where n is an integer between 1 and 4, and $(Hg,Tl,Pb)_1Ba_2Ca_{n-1} Cu_n O_{2n+2}$, where n is an integer between 1 and 4. It is noted that (Bi, Pb), (Tl,Pb) and (Hg, Tl, Pb) indicate doping of Pb, in (Tl, Pb) and (Bi, Pb) compounds and doping of Tl and Pb in (Hg, Ti, Pb) compounds, the doping in any amount. Furthermore, Ca can be used as a dopant in RE for the $REBa_2Cu_3O_7$ compound shown above.

Another embodiment of this invention uses a single crystal substrate which forms a stable orientation upon rolling. A stable rolling orientation is an orientation which does not change upon subsequent rolling. After final rolling, a suitable annealing treatment can be performed to produce a different biaxial texture as compared to the stable rolling orientation. This new recrystallization texture is the desired texture of the substrate. The starting texture of the substrate is related uniquely to the final desired texture.

Another embodiment of this invention may be used to form textured alloys for a variety of applications. For example, a $Nb_3Sn$ alloy may be formed by producing a biaxially textured tape of textured Sn or Nb from a single crystal billet of either material. The other material can be deposited by a variety of deposition methods on the tape and then be diffused in at an elevated temperature to form a biaxially textured alloy.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

EXAMPLE I

It is well known in the work of studying fundamental deformation behavior of metals that certain crystallographic orientations undergo a stable deformation orientation upon rolling. For example an Al single crystal oriented such that it is close to the S-orientation, (348)[11 4 6], when deformed by large amounts by rolling does not undergo a significant change in its orientation, for example see T. Kamijo, H. Adachihara, H. Fukutomi and E. Aernoudt, Acta Meall, 40 (1992) 693–698.

Figure 2:
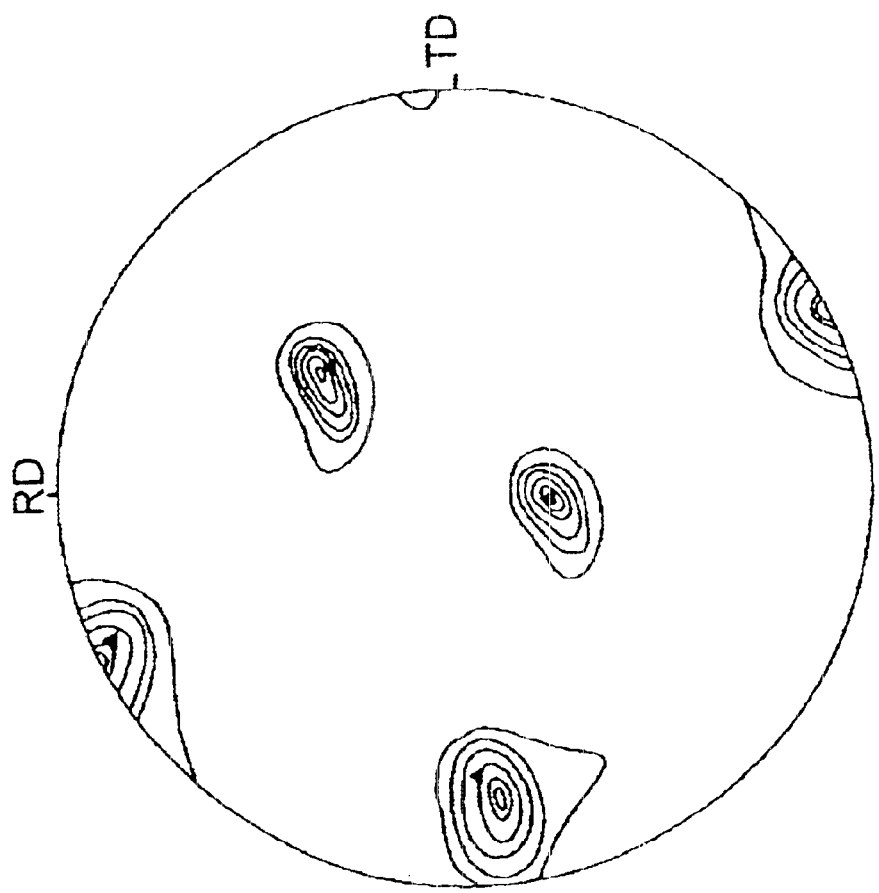
FIG. 2 is a (111) pole figure of an aluminum single crystal after a 97.5% deformation by rolling.

FIG. 2 shows a (111) pole figure of an aluminum single crystal with (348)[11 4 6] orientation, close to the stable S-orientation for rolling. The pole figure was taken after the single crystal was deformed by 97.5%. As can be seen from the pole figure, the center of the four (111) peaks deviates only a few degrees from the initial orientation, so that rolling texture of the crystal can be better defined as (258)[10 4 5] rather than exactly being the initial orientation.

Figure 3:
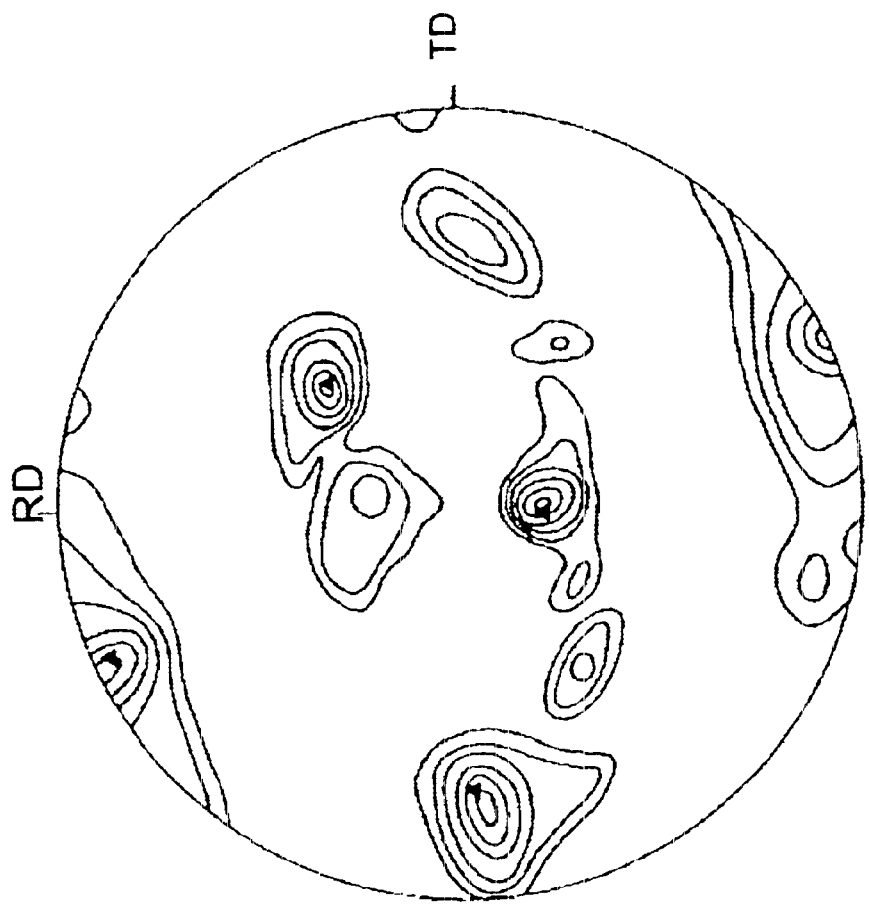
FIG. 3 is a (111) pole figure of an aluminum single crystal after a 99% deformation by rolling.

As shown in FIG. 3, after a 99% deformation of the Al single crystal, the main components of the rolling texture are unchanged but the orientation spread has increased with the increased rolling reduction. Equivalent rolling texture components to the initial orientation, which is symmetrical with respect to the transverse direction as well as which has a common [111] axis inclined 20 degrees from the rolling direction, can be found in the (111) pole figures.

Figure 4:
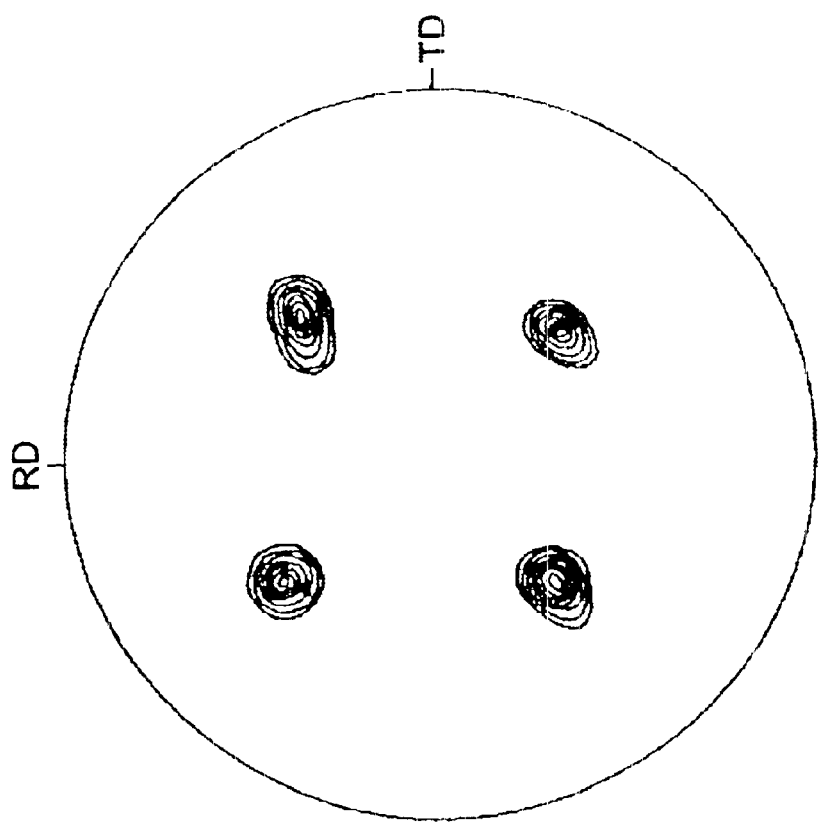
FIG. 4 is a (111) pole figures of the 99% deformed Al single crystal shown in FIG. 3 after annealing.
Figure 5:
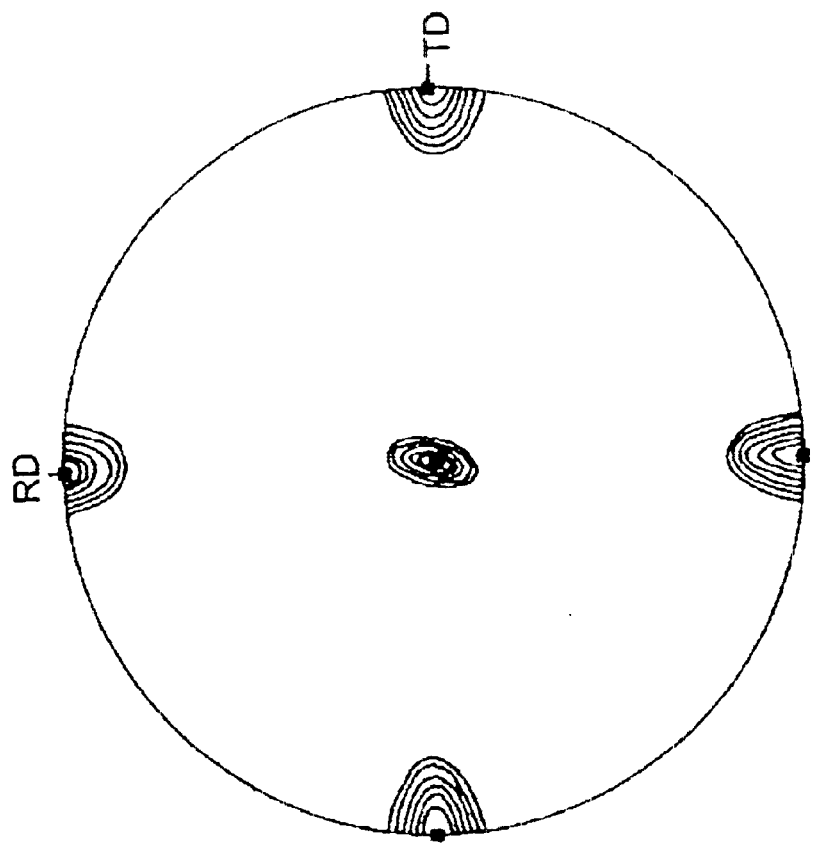
FIG. 5 is a (111) pole figures of the 99% deformed Al single crystal shown in FIG. 3 after annealing.

Upon annealing the rolled Al single crystal at 773 K for 100 seconds results in the formation of a sharp cube texture. FIGS. 4 and 5 show the (111) and (100) pole figures of the single crystal Al after the 99% deformation and annealing noted above. A sharp, single orientation cube texture can be seen in both of these figures.

Once the Al single crystal has been rolled by 99% it becomes a tape, which upon annealing yields a cube textured tape. The cube texture is best obtained when the substrate has a orientation close to the S-orientation.

A similar process can be applied to a Ni-alloy single crystal or any other FCC metal, such as Cu or Ag single crystals. It is preferred to start with a single crystal which has a orientation close to a stable rolling orientation, such as the S-orientation corresponding to the (123)[634] orientation. After heavy deformations using a plurality of passes, using light reductions in each pass, the crystal is converted into a tape. The tape is then annealed to form a cube texture which is the desired texture in most cases. Epitaxial buffer layers and/or device layers can then be deposited on the cube textured tape. Such a method is of great interest, specially for single crystals of Ni-based alloys and Ag and its alloys, polycrystalline forms of which cannot be successfully rolled and annealed to form a cube textured tape.

Alternatively, a single crystal in the shape of a tube can be used, with a superconducting precursor filled inside the tube. If the tube is made of a Ag single crystal with an orientation close to the S-orientation, then upon massive rolling and annealing the Ag sheath generally forms a cube texture. The superconductor precursor can then be made to react so as to grow epitaxially inside the tape.

Example II

Figure 6:
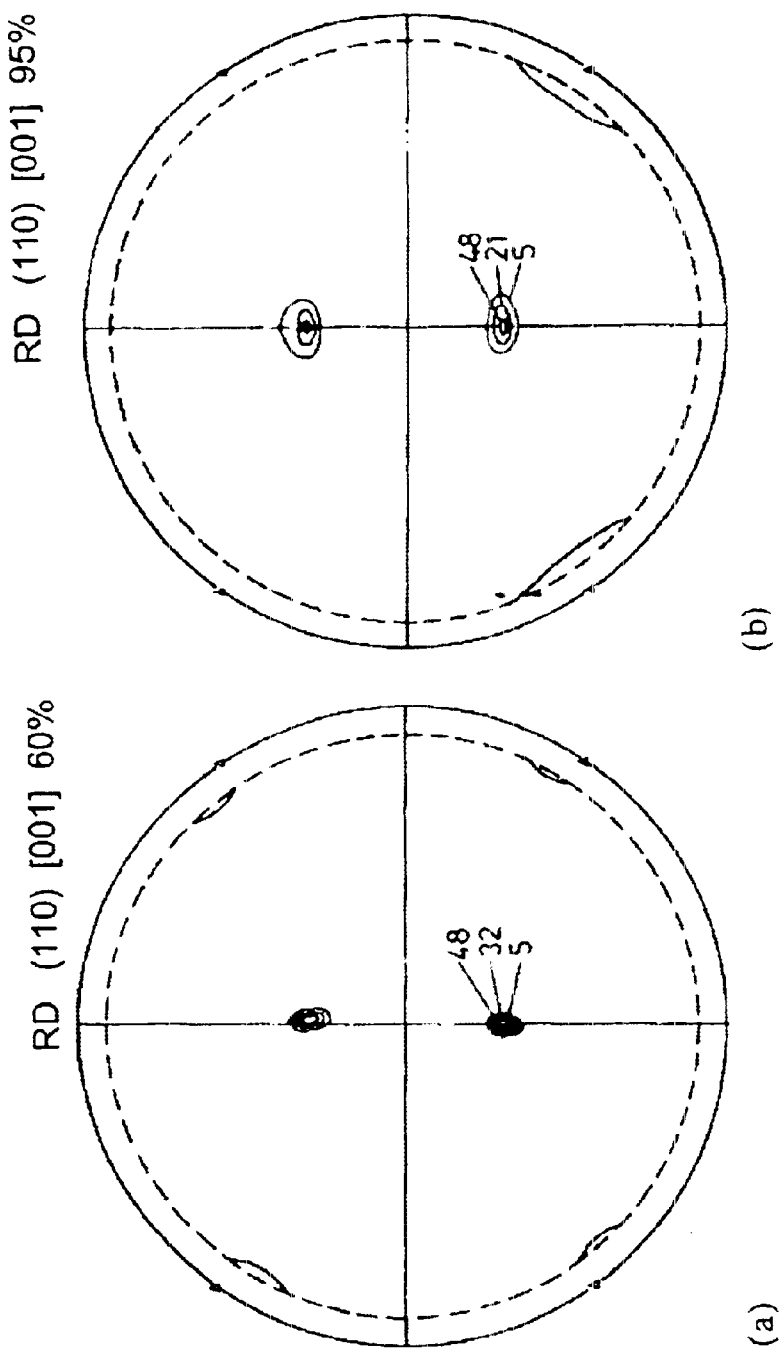
FIGS. 6(a) and (b) are pole figures for Cu single crystals of initial orientation (110)[0011] deformed using rolling by 60% and 95%, respectively.

Another example is provided using Cu single crystals. FIGS. 6(a) and (b) show pole figures for Cu single crystals of initial orientation (110)[001] which were deformed using rolling by 60% and 95%, respectively. The crystallographic orientation of the crystals showed little change after such massive rolling operations (see also M. Wrobel, S. Dymek, M. Blickarski and S. Gorczyca, Z. Metalikunde, 85 (1994) 415).

Figure 7:
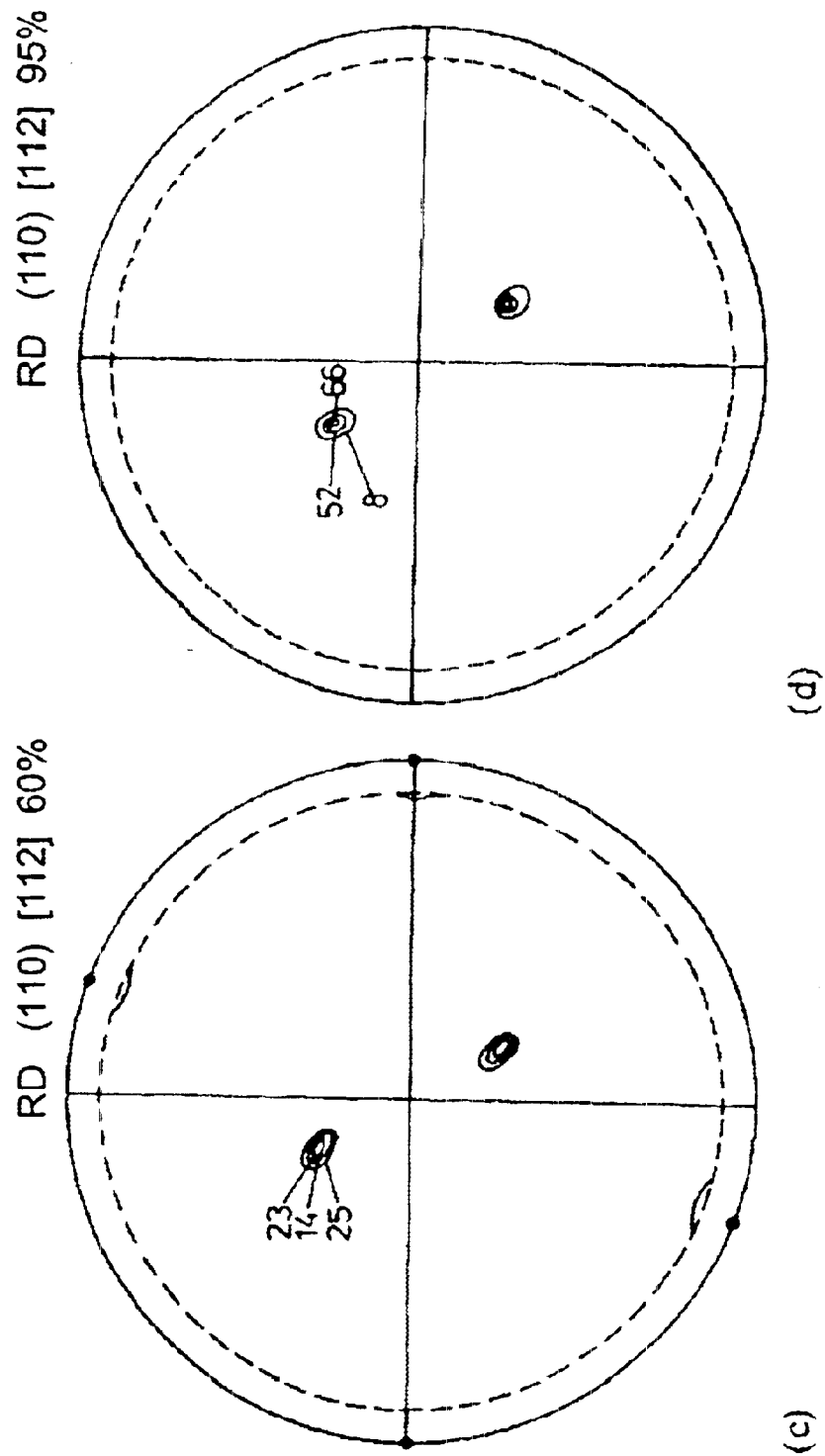
FIGS. 7(a) and (b) are pole figures for Cu single crystals of initial orientation (110)[112] deformed using rolling by 60% and 95%, respectively.

FIGS. 7(a) and (b) are pole figures for Cu single crystals of initial orientation (110)[112] deformed using rolling by 60% and 95%, respectively. The crystallographic orientation of the crystals showed little change after such massive rolling operations (see also M. Wrobel, S. Dymek, M. Blickarski and S. Gorczyca, Z.

Metalikunde, 85 (1994) 415).

Hence, the above establishes two addition stable rolling orientations in FCC metals, the (110)[001] and the (110)[112] orientations. Again as mentioned previously, either buffer layers and/or superconductors can be deposited epitaxially on the tape formed immediately after deformation processing is complete, or after annealing the tape.

In both cases epitaxial layers are deposited on a biaxially textured tape. Again, such a method can be particularly useful for applications desiring single crystals of a Ni-based alloy and Ag and its alloys, and polycrystalline forms of which cannot be successfully rolled and annealed to form a cube textured tape.

Alternatively, a single crystal in the shape of a tube can be used, with a superconducting precursor filled inside the tube. For example, if the tube is made of a Ag single crystal with an orientation close to the stable rolling orientation, then upon massive rolling and/or annealing the Ag sheath can form a biaxial texture. The superconductor precursor can then be made to react so as to grow epitaxially inside the tape.

EXAMPLE III

Figure 8:
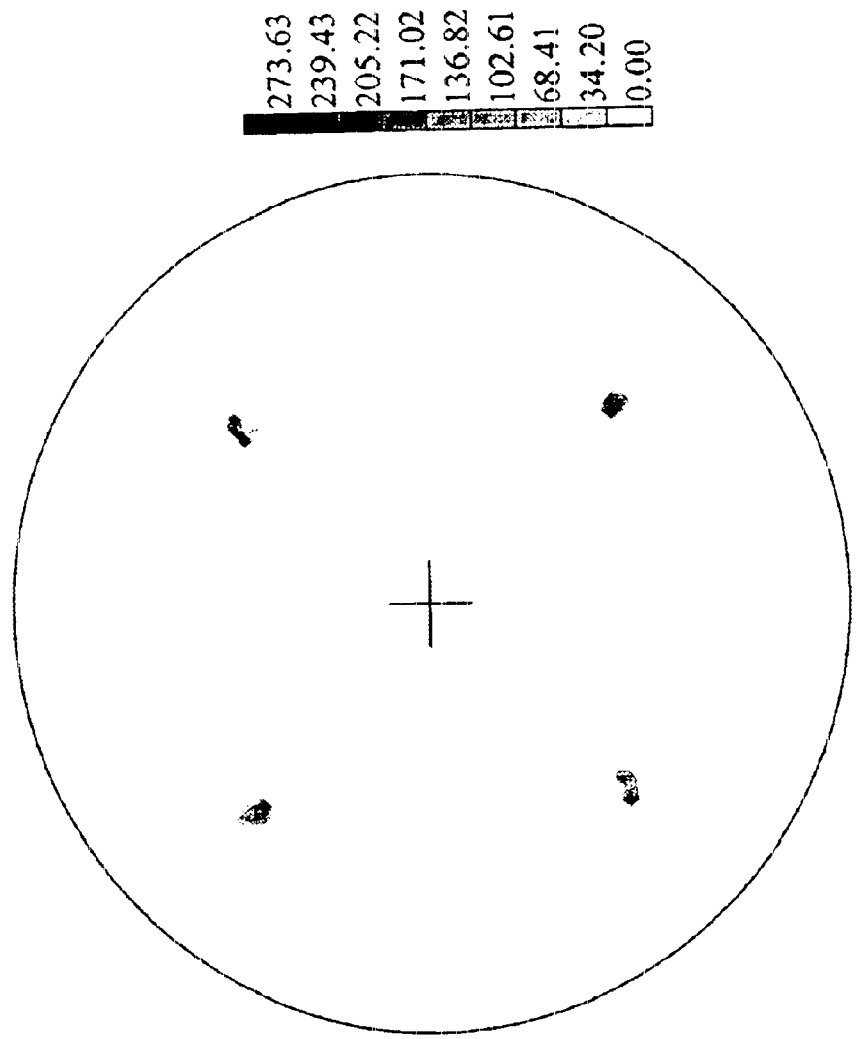
FIG. 8 is a linear pole figure of a Ni single crystal showing its {100}<100> orientation.
Figure 9:
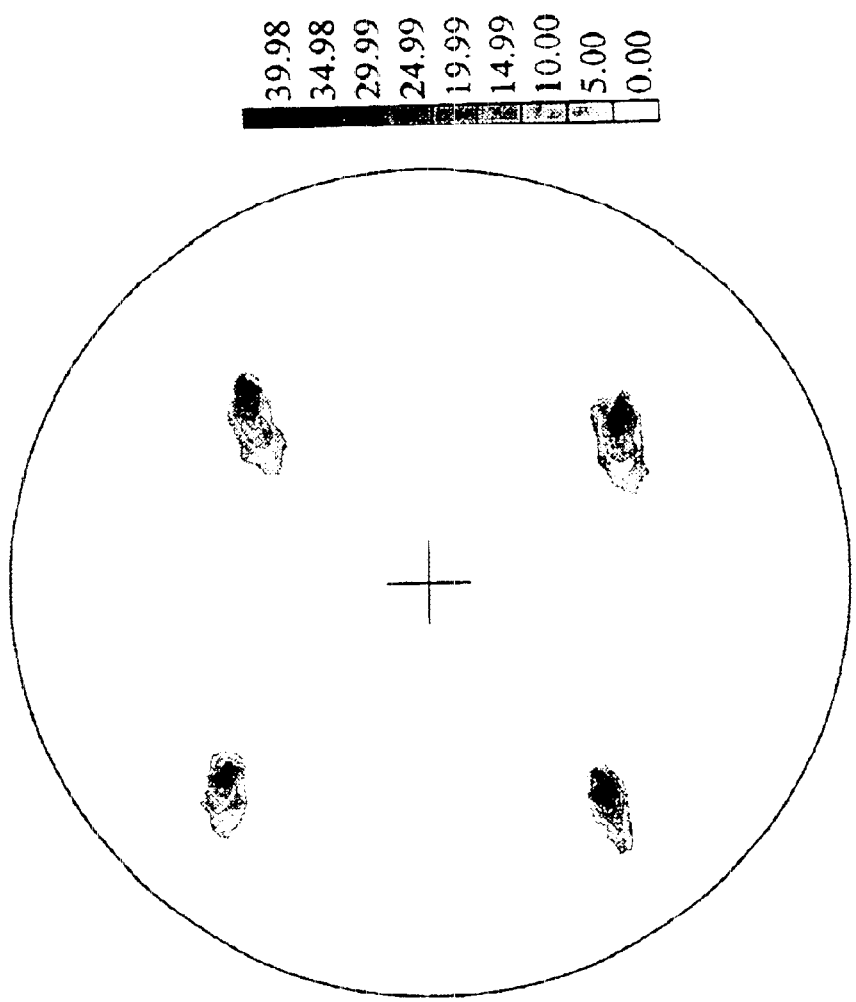
FIG. 9 is a (111) linear pole figure of a deformed Ni single crystal showing deviations or spreading from the {100}<100> orientation.
Figure 10:
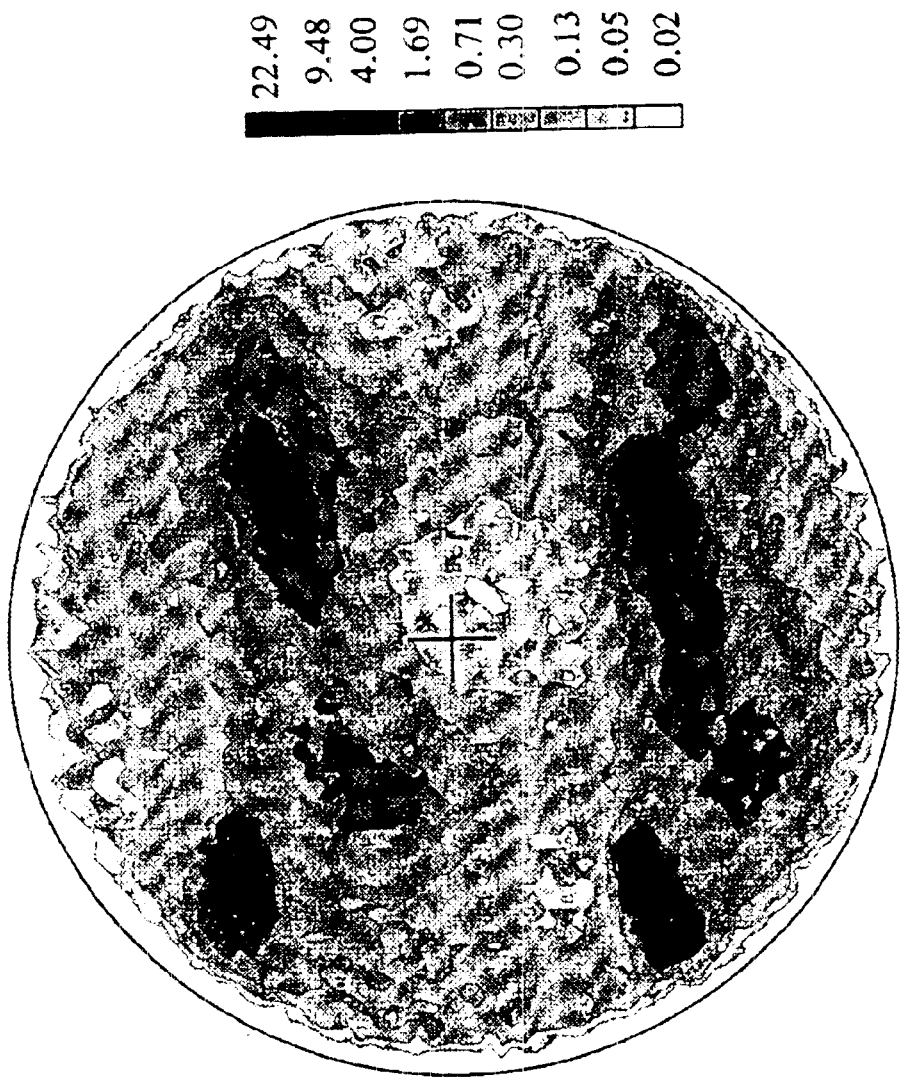
FIG. 10 is a (111) log pole figure of a deformed Ni single crystal showing deviations or spreading f from the {100}<100> orientation.
Figure 11:
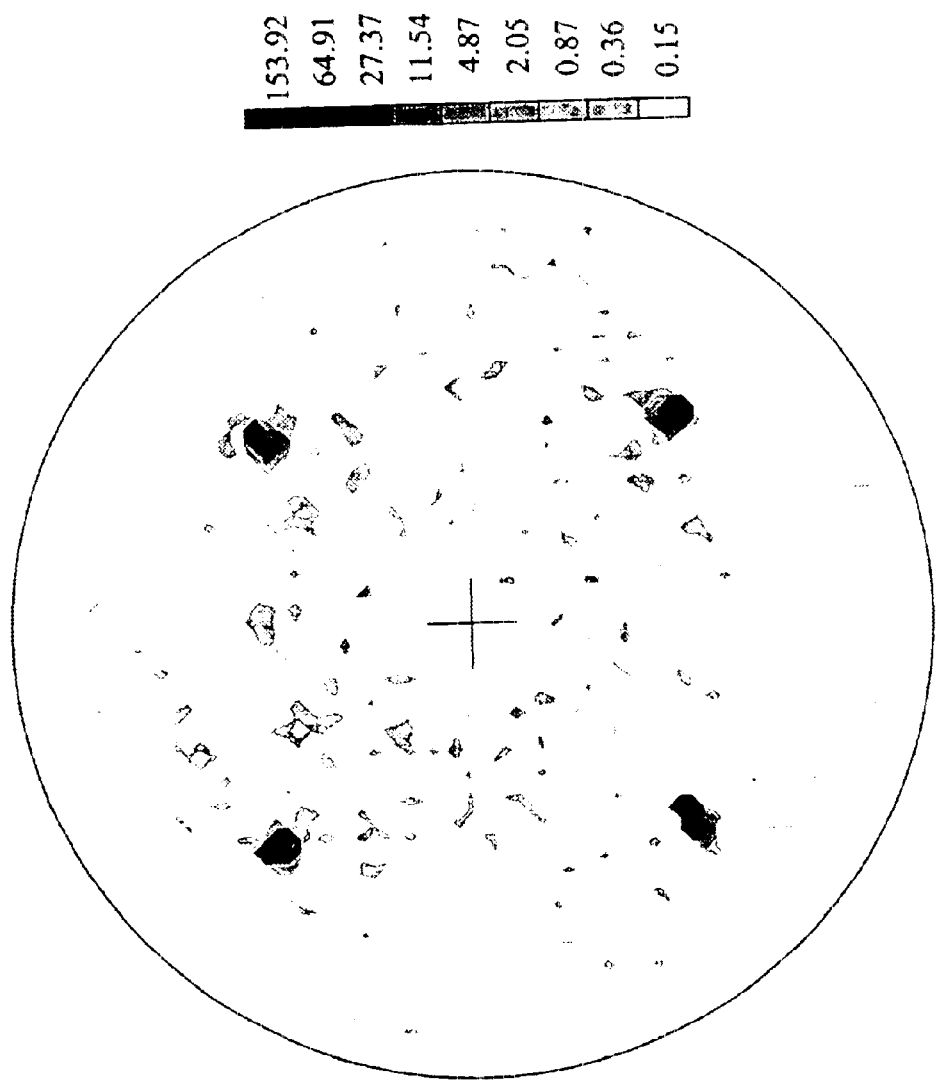
FIG. 11 is a log-scale pole figure of a deformed Ni single crystal after annealing showing recovery of the single crystal.

FIG. 8 shows a linear pole figure of a Ni single crystal of the (100)<100> orientation. The crystal is then deformed using a plurality of deformation steps to a total deformation of 5%. FIGS. 9 and 10 show the (111) pole figures of the 5% deformed crystal in linear and log scales, respectively. The deformed crystal was then annealed at 1300° C. for 1 hr in flowing 4%-$H_2$ in Argon. FIG. 11 shows the log-scale pole figure of the deformed crystal after annealing.

As can be seen from the FIG. 11, the starting cube texture of the Ni single crystal appears completely restored. Such a sequence of successive light deformations with multiple steps followed by high temperature annealing can be used to convert the single crystal into a single crystal tape having a sharp cube texture. Epitaxial buffer layers and/or device layers can then deposited on the cube textured tape. Thus, such a method can be of great interest, especially for single crystals of a Ni-based alloy and Ag and its alloys, polycrystalline forms of which cannot be successfully rolled and annealed to form a cube textured tape. Alternatively, a single crystal in the shape of a tube can be used, with a superconducting precursor preferably filling the tube.

We claim:

1. A method for forming an electronically active biaxially textured article, comprising the steps of:
   providing a substrate having a single crystal metal or metal alloy surface;
   deforming said substrate in a plurality of incremental deformations to form an elongated substrate surface having a biaxial texture surface, and
   depositing an epitaxial electronically active layer on said biaxially textured surface.

2. The method of claim 1, further comprising the step of annealing said substrate after said deforming step prior to said deposition step.

3. The method of claim 1, wherein said deforming step is performed in a plurality of incremental deformations, each of said incremental deformations being followed by annealing steps to restore an original crystallographic orientation of said single crystal metal or metal alloy surface.

4. The method of claim 1, wherein said deforming step is a rolling step and said substrate is selected to result in a stable crystal orientation of said single crystal metal surface following said rolling step.

5. The method of claim 4, further comprising an annealing step after said rolling step, wherein said annealing step recrystallizes said single crystal metal surface to form a texture different from said stable crystal orientation.

6. The method of claim 1, further comprising the step of depositing at least one epitaxial buffer layer on said biaxially textured substrate surface.

7. The method of claim 6, wherein said epitaxial buffer layer is at least one selected from the group consisting of $SrTiO_3$, $LaMnO_3$, $LaAlO_3$, $La_2ZrO_3$, YSZ, $CeO_2$ and $Y_2O_3$.

8. The method of claim 1, wherein said depositing step comprises physical vapor deposition.

9. The method of claim 8, wherein said physical vapor deposition is at least one selected from the group consisting of pulsed laser ablation, sputtering, co-evaporation and pulsed electron beam evaporation.

10. The method of claim 1, wherein said depositing step comprises chemical vapor deposition (CVD).

11. The method of claim 1, wherein said depositing step is at least one selected from the group consisting of metalloorganic CVD, dip coating, spray pyrolysis with metal organics and sol-gel.

12. The method of claim 1, wherein said electronically active layer comprises a superconductor layer.

13. The method of claim 12, wherein said superconductor layer comprises an oxide superconductor.

14. The method of claim 13, wherein said oxide superconductor is preferably selected from $REBa_2Cu_3O_7$ where RE is a rare earth element optionally doped with Ca, $(Bi,Pb)_1Sr_2Ca_{n-1}Cu_nO_{2n+2}$, where n is an integer between 1 and 4, $(Tl,Pb)_1Ba_2Ca_{n-1}Cu_nO_{2n+3}$, where n is an integer between 1 and 4, and $(Hg,Tl,Pb)_1Ba_2Ca_{n-1}Cu_nO_{2n+2}$, where n is an integer between 1 and 4.

15. The method of claim 1, wherein said substrate comprises at least one selected from the group consisting of Ni or Cu and their alloys.

16. The method of claim 1, wherein said substrate comprises Ag or a Ag alloy.

17. The method of claim 1, wherein said substrate does not produce a biaxial texture upon rolling.

18. The method of claim 1, wherein said biaxially textured article is a wire or tape.

19. The method of claim 18, wherein said wire or tape is at least 1 km in length.

20. A powder-in-tube (PIT) method for forming an electronically active biaxially textured article, comprising the steps of:
   providing a single crystal metal or metal alloy tube;
   filling the tube with at least one electronically active precursor of electronically active material;
   deforming said tube to form a biaxially textured sheath;
   annealing said tube, wherein an epitaxial biaxial electronically active layer is formed from said precursor on said biaxially textured sheath.

21. The method of claim 20, wherein said filling step comprises inserting at least one rod of said precursor in said tube.

22. The method of claim 20, wherein said single crystal metal or metal alloy tube comprises Ag or a Ag alloy.

23. The method of claim 20, wherein said electronically active layer comprises a superconductor layer.

24. The method of claim 23, wherein said superconductor layer comprises an oxide superconductor.

25. The method according to claim 24, wherein said oxide superconductor is preferably selected from $REBa_2Cu_3O_7$ where RE is a rare earth element optionally doped with Ca, $(Bi,Pb)_1Sr_2Ca_{n-1}Cu_nO_{2n+2}$, where n is an integer between 1 and 4, $(Tl,Pb)_1Ba_2Ca_{n-1}Cu_nO_{2n+3}$, where n is an integer between 1 and 4, and $(Hg,Tl,Pb)_1Ba_2Ca_{n-1}Cu_nO_{2n+2}$, where n is an integer between 1 and 4.

26. The method of claim 20, wherein said tube does not produce a biaxial texture upon rolling.

27. The method of claim 20, wherein said biaxially textured article is a wire or tape.

28. The method of claim 27, wherein said wire or tape is at least 1 km in length.

29. The method of claim 20, wherein said method comprises a plurality said deforming and said annealing steps, said deforming steps being incremental deformations, each of said incremental deformations being followed respective ones of said annealing steps to restore an original crystallographic orientation of said tube.

30. A method for forming textured alloy articles having biaxial texture, comprising the steps of:
   providing a substrate having a single crystal metal surface;
   deforming said substrate to form an elongated substrate surface having biaxial texture on said elongated substrate surface, and
   diffusing a second metal into said elongated substrate surface to form a biaxially textured alloy, said second metal being different from said first metal.

31. The method of claim 30, further comprising the step of annealing said substrate to produce said biaxially texture substrate surface.

32. The method of claim 30, wherein said deforming step is performed using a plurality of incremental deformations, each of said incremental deformations being followed by annealing steps to restore an original crystallographic orientation of said single substrate.

33. The method of claim 30, wherein said deforming step is a rolling step which results in a stable crystal orientation of said single crystal metal surface.

34. The method of claim 33, further comprising an annealing step after said rolling step, wherein said annealing step recrystallizes said single crystal metal surface to form a texture different from said stable crystal orientation.

35. The method of claim 30, further comprising the step of depositing at least one epitaxial buffer layer on a surface of said biaxially textured alloy.

36. The method of claim 35, wherein said epitaxial buffer layer is at least one selected from the group consisting of $SrTiO_3$, $LaMnO_3$, $LaAlO_3$, $La_2ZrO_3$, YSZ, $CeO_2$ and $Y_2O_3$.

37. The method of claim 35, wherein said depositing step comprises physical vapor deposition.

38. The method of claim 37, wherein said physical vapor deposition is at least one selected from the group consisting of pulsed laser ablation, sputtering, co-evaporation and pulsed electron beam evaporation.

39. The method of claim 35, wherein said depositing step comprises chemical vapor deposition (CVD).

40. The method of claim 35, wherein depositing step is at least one selected from the group consisting of metallo-organic CVD, dip coating, spray pyrolysis with metal organics and sol-gel.

41. The method of claim 30, further comprising the step of depositing an epitaxial electronically active layer on a surface of said biaxially textured alloy.

42. The method of claim 41, wherein said electronically active layer comprises a superconductor layer.

43. The method of claim 42, wherein said superconductor layer comprises an oxide superconductor.

44. The method of claim 43, wherein said oxide superconductor is preferably selected from $REBa_2Cu_3O_7$ where RE is a rare earth element optionally doped with Ca, $(Bi,Pb)_1Sr_2Ca_{n-1}Cu_nO_{2n+2}$, where n is an integer between 1 and 4, $(Tl, Pb)_1Ba_2Ca_{n-1}Cu_nO_{2n+3}$, where n is an integer between 1 and 4, and $(Hg,Tl,Pb)_1Ba_2Ca_{n-1}Cu_nO_{2n+2}$, where n is an integer between 1 and 4.

45. The method of claim 30, wherein said substrate does not produce a biaxial texture upon rolling.

46. The method of claim 30, wherein said biaxially textured alloy article is a wire or tape.

47. The method of claim 46, wherein said wire or tape is at least 1 km in length.

* * * * *